(12) United States Patent
Ungnapatanin et al.

(10) Patent No.: US 9,653,501 B2
(45) Date of Patent: May 16, 2017

(54) IMAGE SENSOR INCLUDING COLOR FILTER AND METHOD OF MANUFACTURING THE IMAGE SENSOR

(71) Applicant: SAMSUNG ELECTRONICS CO., LTD., Suwon-si (KR)

(72) Inventors: Jesada Ungnapatanin, Seongnam-si (KR); Seokho Yun, Hwaseong-si (KR); Doyoon Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/049,658

(22) Filed: Feb. 22, 2016

(65) Prior Publication Data

US 2016/0260762 A1    Sep. 8, 2016

(30) Foreign Application Priority Data

Mar. 2, 2015    (KR) .......................... 10-2015-0029107

(51) Int. Cl.
*H01L 31/0232*    (2014.01)
*H01L 27/146*    (2006.01)

(52) U.S. Cl.
CPC .... *H01L 27/14621* (2013.01); *H01L 27/1463* (2013.01); *H01L 27/14625* (2013.01); *H01L 27/14645* (2013.01); *H01L 27/14685* (2013.01)

(58) Field of Classification Search
CPC ......... H01L 27/14621; H01L 27/14625; H01L 27/14685; H01L 27/14645; H01L 27/1463
USPC ........................................................ 257/432
See application file for complete search history.

(56) References Cited

FOREIGN PATENT DOCUMENTS

WO    2014/077475 A1    5/2014

*Primary Examiner* — Anthony Ho
(74) *Attorney, Agent, or Firm* — Sughrue Mion, PLLC

(57) ABSTRACT

An image sensor including a color filter and a method of manufacturing the image sensor are provided. The image sensor includes a light-sensing layer configured to detect incident light, and convert the incident light to an electrical signal. The image sensor further includes a color filter layer disposed on the light-sensing layer, the color filter layer including color filters, each of the color filters being configured to transmit, among the incident light, light in a wavelength band to the light-sensing layer. The image sensor further includes an isolation layer disposed between the color filters, the isolation layer being configured to optically isolate the color filters from each other. An upper portion of each of the color filters has a cylindrical shape, and a lower portion of each of the color filters has a hemispherical shape.

10 Claims, 7 Drawing Sheets

IMAGE SENSOR INCLUDING COLOR FILTER AND METHOD OF MANUFACTURING THE IMAGE SENSOR

CROSS-REFERENCE TO RELATED APPLICATION

This application claims priority from Korean Patent Application No. 10-2015-0029107, filed on Mar. 2, 2015, in the Korean Intellectual Property Office, the disclosure of which is incorporated herein by reference in its entirety.

BACKGROUND

1. Field

Apparatuses and methods consistent with exemplary embodiments relate to an image sensor including a color filter, and methods of manufacturing the image sensor.

2. Description of the Related Art

A color display device displays an image having various colors, and a color image sensor detects a color of incident light by using a color filter. For example, a color display device or a color image sensor may include an array of a red color filter that transmits only red light therethrough, a green color filter that transmits only green light therethrough, and a blue color filter that transmits only blue light therethrough. Accordingly, a red pixel over which the red color filter is placed may display or detect only red light, a green pixel over which the green color filter is placed may display or detect only green light, and a blue pixel over which the blue color filter is placed may display or detect only blue light. In this structure, a specific color may be displayed by adjusting the intensity of light in the red pixel, the green pixel, and the blue pixel, or a color of incident light may be determined by detecting the intensity of light in the red pixel, the green pixel, and the blue pixel. Also, instead of an RGB color filter method, a CYGM color filter method in which cyan, yellow, green, and magenta color filters are placed over four pixels may be adopted.

In general, an imaging apparatus may include one object lens and a color image sensor. The object lens may focus light, which is incident from the outside, on the color image sensor, and the color image sensor may detect the light focused by the object lens. However, light is almost vertically incident on pixels of a central portion of the color image sensor that are close to an optical axis of the object lens, whereas light is obliquely incident on pixels of an edge portion of the color image sensor that are far from the optical axis of the object lens. Various technologies for forming an accurate image in consideration of a change in an angle of incidence according to a position of a pixel of a color image sensor have been suggested.

SUMMARY

Exemplary embodiments address at least the above problems and/or disadvantages and other disadvantages not described above. Also, the exemplary embodiments are not required to overcome the disadvantages described above, and may not overcome any of the problems described above.

Exemplary embodiments provide an image sensor including a color filter having a structure for preventing crosstalk and light loss at an edge portion of the image sensor, and methods of manufacturing the image sensor.

According to an aspect of an exemplary embodiment, there is provided an image sensor including an image sensor including a light-sensing layer configured to detect incident light, and convert the incident light to an electrical signal. The image sensor further includes a color filter layer disposed on the light-sensing layer, the color filter layer including color filters, each of the color filters being configured to transmit, among the incident light, light in a wavelength band to the light-sensing layer. The image sensor further includes an isolation layer disposed between the color filters, the isolation layer being configured to optically isolate the color filters from each other. An upper portion of each of the color filters has a cylindrical shape, and a lower portion of each of the color filters has a hemispherical shape.

The isolation layer may have a refractive index less than refractive indices of the color filters.

The light-sensing layer may include light-sensing cells, and a separation layer disposed between the light-sensing cells.

The color filters may include a first color filter configured to transmit, among the incident light, light in a first wavelength band through the first color filter to the light-sensing layer, a second color filter configured to transmit, among the incident light, light in a second wavelength band through the second color filter to the light-sensing layer, and a third color filter configured to transmit, among the incident light, light in a third wavelength band through the third color filter to the light-sensing layer.

The image sensor may further include a color separation element disposed to face the first color filter.

The color separation element may be configured to cause, among the incident light, the light in the first wavelength band to travel to the first color filter, the light in the second wavelength band to travel to the second color filter, and the light in the third wavelength band to travel to the third color filter.

The image sensor may further include a transparent dielectric layer disposed on the color filter layer, and the color separation element may be disposed in the transparent dielectric layer.

The color separation element may be configured to cause, among the incident light, the light in the first wavelength band to travel to the first color filter, and light including the light in the second wavelength band and the light in the third wavelength band to travel to the second color filter and the third color filter.

The isolation layer may include at least one selected from the group consisting of polymethylmetacrylate, silicon acrylate, cellulose acetate butyrate, silicon oxide, and fluorosilicon acrylate.

The color filter layer may include a first pixel row including a first portion of first color filters configured to transmit, among the incident light, light in a first wavelength band through the first color filters to the light-sensing layer, and second color filters configured to transmit, among the incident light, light in a second wavelength band through the second color filters to the light-sensing layer. The color filter layer may further include a second pixel row including a second portion of the first color filters, and third color filters configured to transmit, among the incident light, light in a third wavelength band through the third color filters to the light-sensing layer.

According to an aspect of another exemplary embodiment, there is provided a method of manufacturing an image sensor, the method including forming a light-sensing layer, forming an isolation layer on the light-sensing layer, forming cylindrical shapes in upper portions of the isolation layer, forming hemispherical shapes in lower portions of the isolation layer, and forming color filters in the upper portions and the lower portions of the isolation layer.

The method may further include forming a separation layer between light-sensing cells of the light-sensing layer.

The light-sensing layer may be configured to detect incident light, and convert the incident light to an electrical signal.

BRIEF DESCRIPTION OF THE DRAWINGS

The above and/or other aspects will be more apparent by describing exemplary embodiments with reference to the accompanying drawings in which.

DETAILED DESCRIPTION OF THE EXEMPLARY EMBODIMENTS

Figure 1A:
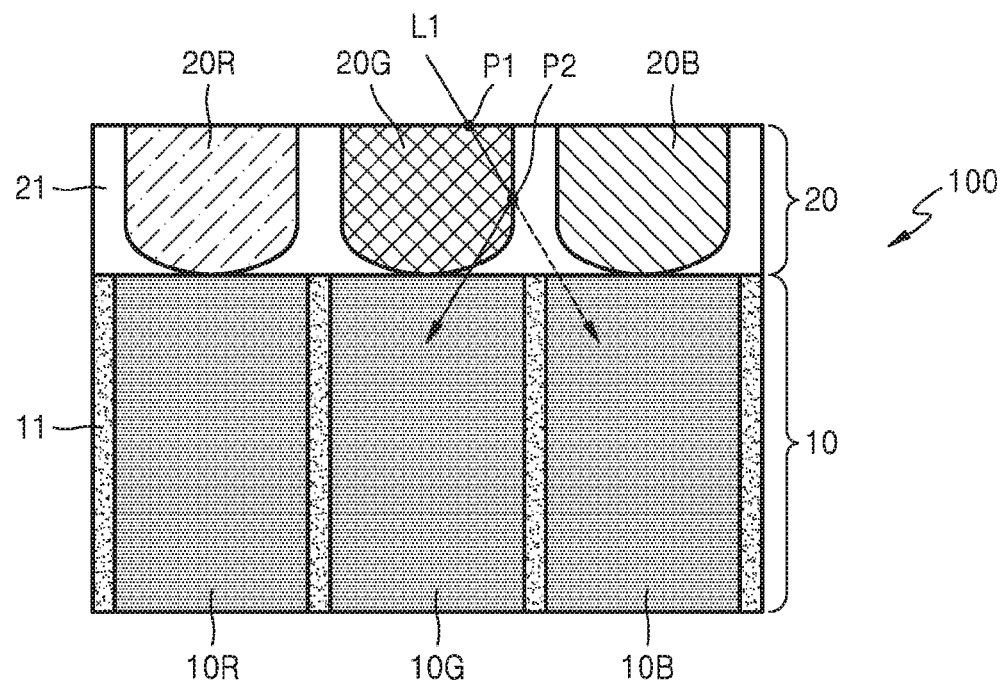
FIGS. 1A and 1B are cross-sectional views illustrating a structure of an image sensor according to an exemplary embodiment.

Exemplary embodiments are described in greater detail herein with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those defined matters. Also, well-known functions or constructions are not described in detail because they would obscure the description with unnecessary detail.

In the drawings, sizes of components may be exaggerated for clarity. The exemplary embodiments may have different forms and should not be construed as limited to the exemplary embodiments set forth herein. For example, it will also be understood that when a layer is referred to as being "on" another layer, it can be directly on the other layer, or intervening layers may also be present therebetween. As used herein, the term "and/or" includes any and all combinations of one or more of the associated listed items. Expressions such as "at least one of," when preceding a list of elements, modify the entire list of elements and do not modify the individual elements of the list.

Figure 1B:
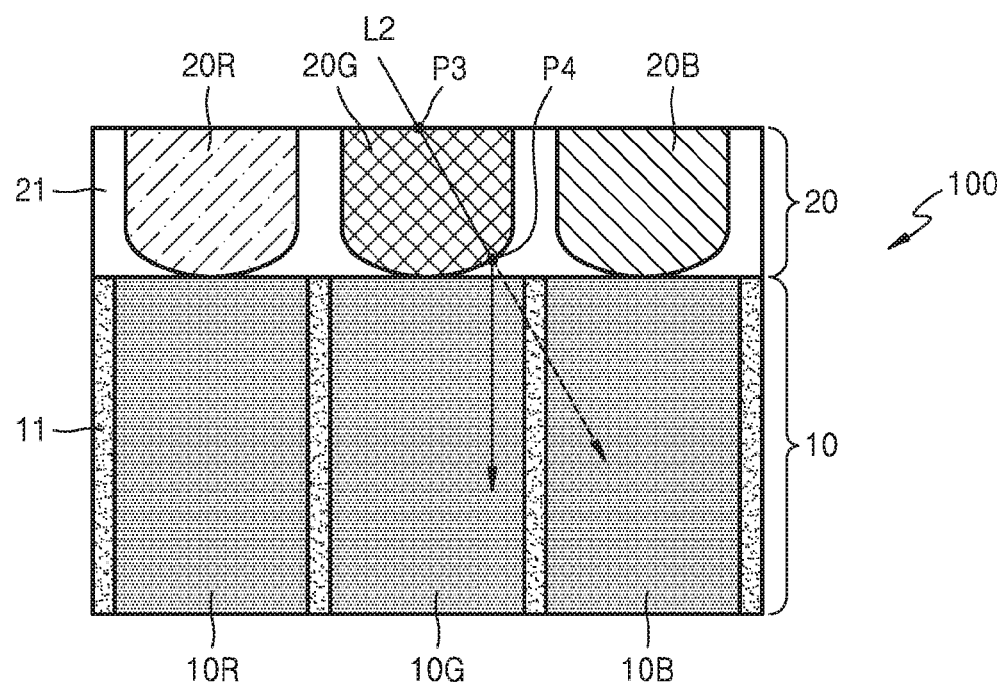

FIGS. 1A and 1B are cross-sectional views illustrating a structure of an image sensor 100 according to an exemplary embodiment. Referring to FIGS. 1A and 1B, the image sensor 100 includes a light-sensing layer 10 that detects incident light and generates an electrical signal based on the detected light, and a color filter layer 20 that is disposed on the light-sensing layer 10 and includes a plurality of color filters, each of which transmits only light in a desired wavelength band therethrough and sends the transmitted light to the light-sensing layer 10. The image sensor 100 further includes an isolation layer 21 that is disposed between the plurality of color filters.

The light-sensing layer 10 is divided into a plurality of light-sensing cells. For example, the plurality of light-sensing cells includes a red light-sensing cell 10R, a green light-sensing cell 10G, and a blue light-sensing cell 10B. Although only one red light-sensing cell 10R, only one green light-sensing cell 10G, and only one blue light-sensing cell 10B are illustrated in FIGS. 1A and 1B, the present exemplary embodiment is not limited thereto, and a plurality of the red light-sensing cells 10R, a plurality of the green light-sensing cells 10G, and a plurality of the blue light-sensing cells 10B may be arranged in a two-dimensional (2D) array. Each of the red, green, and blue light-sensing cells 10R, 10G, and 10B independently converts the intensity of incident light into an electrical signal. For example, an electrical signal that is generated by the red light-sensing cell 10R depends on only the intensity of light that is incident on the red light-sensing cell 10R, irrespective of the intensity of light that is incident on the green and blue light-sensing cells 10G and 10B that are adjacent to the red light-sensing cell 10R. The light-sensing layer 10 may include, for example, a charge-coupled device (CCD), a photodiode, or a complementary metal-oxide-semiconductor (CMOS).

Also, a separation layer 11 is disposed between the red, green, and blue light-sensing cells 10R, 10G, and 10B. The separation layer 11 may prevent electrons that are generated in each of the red, green, and blue light-sensing cells 10R, 10G, and 10B from crossing over to other adjacent ones of the red, green, and blue light-sensing cells 10R, 10G, and 10B.

The plurality of color filters may be respectively disposed on the red, green, and blue light-sensing cells 10R, 10G, and 10B. For example, the plurality of color filters may include a red color filter 20R that transmits light in a red wavelength band, a green color filter 20G that transmits light in a green wavelength band, and a blue color filter 20B that transmits light in a blue wavelength band, among the incident light. Although only one red color filter 20R, only one green color filter 20G, and only one blue color filter 20B are illustrated in FIGS. 1A and 1B, a plurality of the red color filters 20R, a plurality of the green color filters 20G, and a plurality of the blue color filters 20B may be arranged in a 2D array on the light-sensing layer 10.

Also, upper portions of the red, green, and blue color filters 20R, 20G, and 20B may have cylindrical shapes, and lower portions of the red, green, and blue color filters 20R, 20G, and 20B may have hemispherical shapes. The lower portions of the red, green, and blue color filters 20R, 20G, and 20B do not have to have hemispherical shapes, and may bulge downward.

Although the plurality of color filters are arranged in an order of the red color filter 20R, the green color filter 20G, and the blue color filter 20B in FIGS. 1A and 1B, the present exemplary embodiment is not limited to the order. Furthermore, although the color filter layer 20 includes the red color filter 20R, the green color filter 20G, and the blue color filter 20B, the present exemplary embodiment is not limited thereto, and the color filter layer 20 may include color filters of different colors. For example, the color filter layer 20 may include a cyan color filter, a yellow color filter, a green color filter, and a magenta color filter. Alternatively, the color filter layer 20 may include filters that transmit therethrough light in other wavelength bands, for example, an infrared band and an ultraviolet band. It will be understood that colors of the red, green, and blue color filters 20R, 20G, and 20B and an order in which the red, green, and blue color filters 20R, 20G, and 20B are arranged are examples.

The isolation layer 21 is disposed between the red, green, and blue color filters 20R, 20G, and 20B, and optically isolates the red, green, and blue color filters 20R, 20G, and 20B from other adjacent ones of the red, green, and blue color filters 20R, 20G, and 20B. To this end, the isolation layer 21 may be formed of a material having a refractive index that is lower than refractive indices of the red, green, and blue color filters 20R, 20G, and 20B. For example, the isolation layer 21 may be formed of a material such as polymethylmetacrylate (PMMA), silicon acrylate, cellulose acetate butyrate (CAB), silicon oxide ($SiO_2$), or fluorosilicon acrylate (FSA). The isolation layer 21 may be formed of any material as long as a condition for a refractive index is satisfied, and may use a material that may be formed by using physical vapor deposition (PVD) or chemical vapor deposition (CVD).

The isolation layer 21 may totally reflect light that is obliquely incident through light incident surfaces of the red, green, and blue color filters 20R, 20G, and 20B and escapes through side surfaces of the red, green, and blue color filters 20R, 20G, and 20B, and thus may optically isolate the red, green, and blue color filters 20R, 20G, and 20B from the other adjacent ones of the red, green, and blue color filters 20R, 20G, and 20B. For example, as shown in FIG. 1A, light L1 that is obliquely incident on a point P1 on the light incident surface of the green color filter 20G reaches a point P2 on the side surface of the green color filter 20G. The side surface of the green color filter 20G is an interface with the isolation layer 21 having the refractive index that is lower than that of the green color filter 20G. Accordingly, the light L1 may be totally reflected from the point P2 into the green color filter 20G. Next, the light L1 is incident on the green light-sensing cell 120G, and may help the green light-sensing cell 10G to output a signal.

If there is no isolation layer 21, as indicated by a dashed arrow in FIG. 1A, the light L1 may be incident on the blue light-sensing cell 10B that is adjacent to the green light-sensing cell 10G, and may help the blue light-sensing cell 10B to output a signal. As a result, light loss may occur in the green light-sensing cell 10G, and excessive light may be incident on the blue light-sensing cell 10B, thereby generating inaccurate color information of an image that is formed using image data generated by the image sensor 100.

The lower portions of the red, green, and blue color filters 20R, 20G, and 20B may have hemispherical shapes, and may refract light, which is obliquely incident, to centers of the red, green, and blue light-sensing cells 10R, 10G, and 10B. Thus the red, green, and blue color filters 20R, 20G, and 20B may be optically isolated from the other adjacent ones of the red, green, and blue color filters 20R, 20G, and 20B. For example, as shown in FIG. 1B, light L2 that is obliquely incident on a point P3 on the light incident surface of the green color filter 20G reaches a point P4 on the hemispherical lower portion of the green color filter 20G. The hemispherical lower portion of the green color filter 20G is an interface with the isolation layer 21 having the refractive index that is lower than that of the green color filter 20G. Accordingly, the light L2 may be refracted from the point P4 to centers of the green color filter 20G and the green light-sensing cell 10G. The light L2 may help the green light-sensing cell 10G to output a signal.

If the lower portions of the red, green, and blue color filters 20R, 20G, and 20B do not have hemispherical shapes, light that is incident at an angle may reach adjacent red, green, and blue light-sensing cells 10R, 10G, and 10B without being refracted by hemispherical lower portions. As marked by a dashed arrow in FIG. 1B, the light L2 may reach the blue light-sensing cell 10B that is adjacent to the green light-sensing cell 10G, and thus may help the blue light-sensing cell 10G to output a signal. As a result, light loss may occur in the green light-sensing cell 10G, and excessive light may be incident on the blue light-sensing cell 10B, thereby generating inaccurate color information of an image that is formed using image data generated by the image sensor 100.

The image sensor 100 according to the present exemplary embodiment may prevent light loss and crosstalk by using the isolation layer 21 and the red, green, and blue color filters 20R, 20G, and 20B having hemispherical shapes. Accordingly, light use efficiency may be improved, and an accurate color may be detected. An imaging apparatus including the image sensor 100 may capture accurate color information even at an edge portion of the image sensor 100 on which light is obliquely incident.

Figure 2:
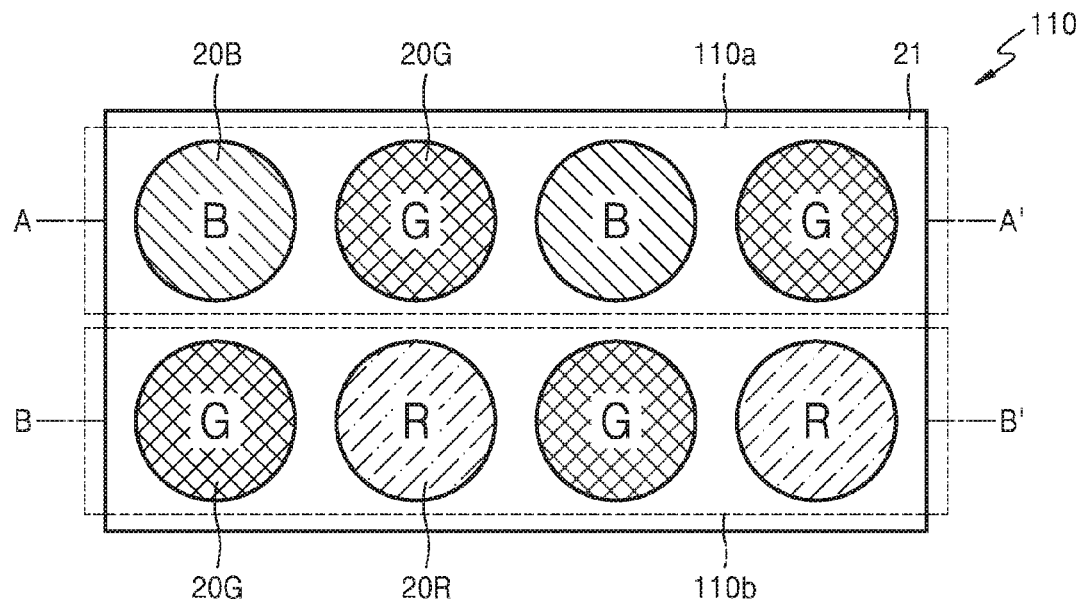
FIG. 2 is a plan view illustrating a pixel structure of an image sensor according to another exemplary embodiment.

FIG. 2 is a plan view illustrating a pixel structure of an image sensor 110 according to another exemplary embodiment. Referring to FIG. 2, the image sensor 110 has a Bayer pattern in which two green color filters 20G are arranged in a first diagonal direction and one blue color filter 20B and one red color filter 20R are arranged in a second diagonal direction that intersects the first diagonal direction. The image sensor 110 having the Bayer pattern includes a first pixel row 110a including a plurality of the blue color filters 20B and a plurality of the green color filters 20G that are alternately arranged in a horizontal direction, and a second pixel row 110b including a plurality of the green color filters 20G and a plurality of the red color filters 20R that are alternately arranged in the horizontal direction. Although only one first pixel row 110a and only one second pixel row 110b are illustrated in FIG. 2, a plurality of the first pixel rows 110a and a plurality of the second pixel rows 110b may be alternately arranged in a vertical direction. The isolation layer 21 is disposed around each of the blue color filters 20B, the green color filters 20G, and the red color filters 20R.

Figure 3A:
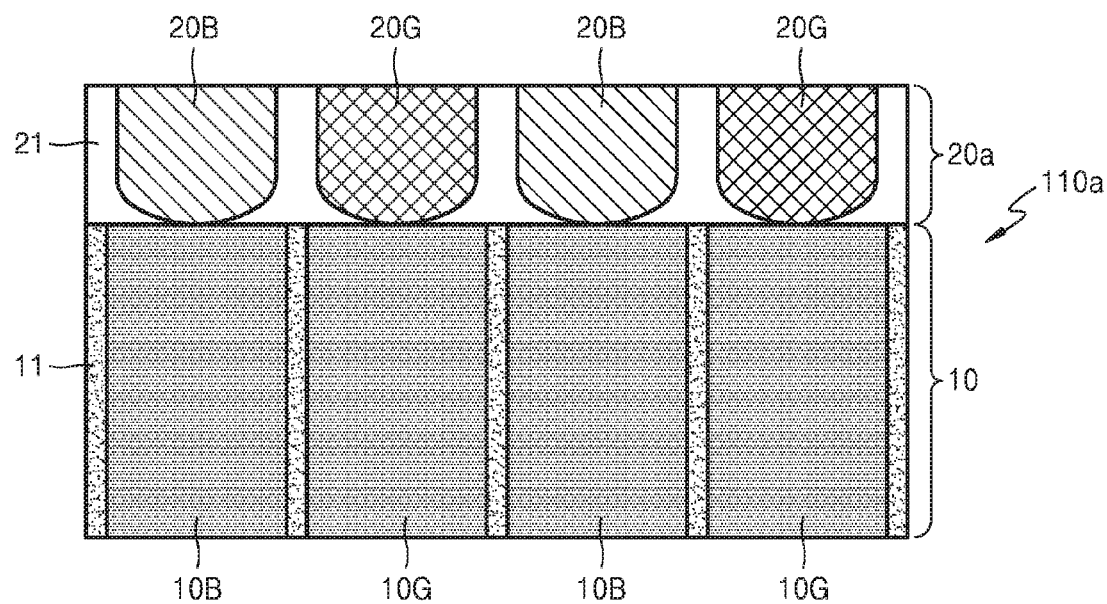
FIG. 3A is a cross-sectional view illustrating a first pixel row, taken along a line A-A' of the image sensor of FIG. 2.

FIG. 3A is a cross-sectional view illustrating the first pixel row 110a, taken along a line A-A' of the image sensor 110 of FIG. 2. Referring to FIG. 3A, a first color filter layer 20a includes the plurality of blue color filters 20B and the plurality of green color filters 20G that are alternately arranged on the light-sensing layer 10. The blue color filters 20B and the green color filters 20G are respectively placed over the blue light-sensing cells 10B and the green light-sensing cells 10G.

Figure 3B:
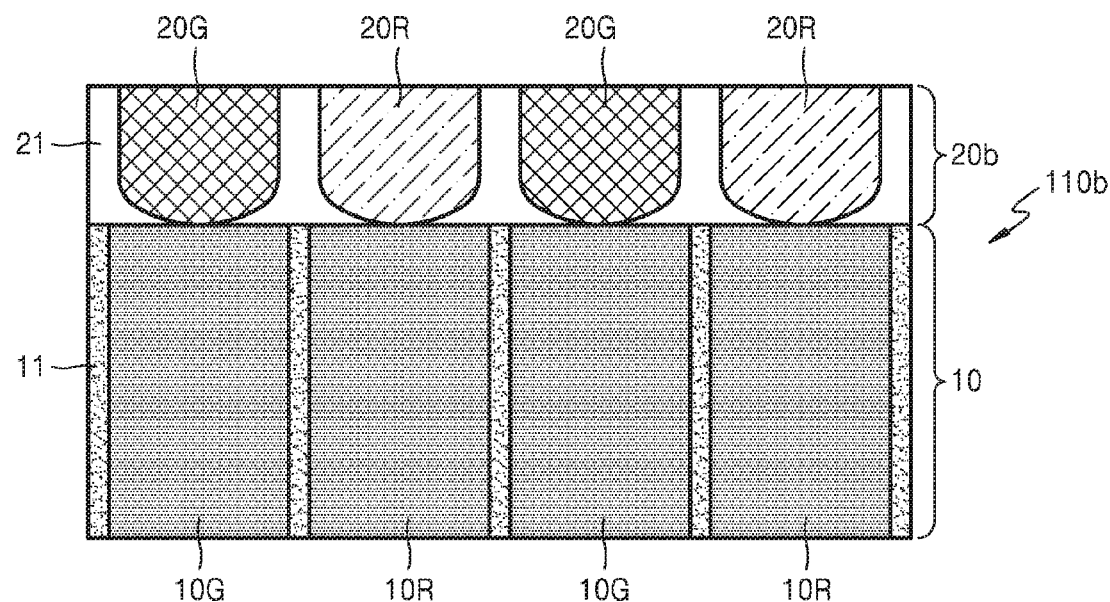
FIG. 3B is a cross-sectional view illustrating a second pixel row, taken along a line B-B' of the image sensor of FIG. 2.

FIG. 3B is a cross-sectional view illustrating the second pixel row 110b, taken along a line B-B' of the image sensor 110 of FIG. 2. Referring to FIG. 3B, a second color filter layer 20b includes the plurality of green color filters 20G and the plurality of red color filters 20R that are alternately arranged on the light-sensing layer 10. The green color filters 20G and the red color filters 20R are respectively placed over the green light-sensing cells 10G and the red light-sensing cells 10R.

Figure 4:
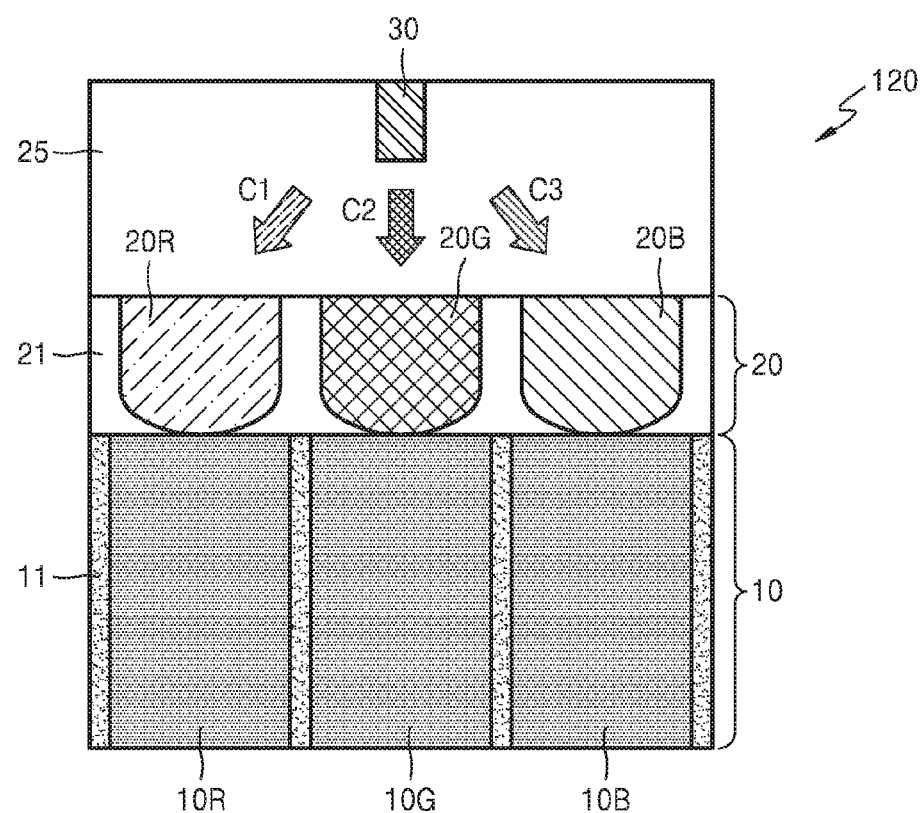
FIG. 4 is a cross-sectional view illustrating a structure of an image sensor according to another exemplary embodiment.

FIG. 4 is a cross-sectional view illustrating a structure of an image sensor 120 according to another exemplary embodiment. Referring to FIG. 4, the image sensor 120 includes the light-sensing layer 10 that detects incident light and generates an electrical signal based on the detected light, and the color filter layer 20 that is disposed on the light-sensing layer 10 and includes the red, green, and blue color filters 20R, 20G, and 20B that transmit light in a desired wavelength band therethrough and send the transmitted light to the light-sensing layer 10. The image sensor 120 further includes the isolation layer 21 that is disposed between the red, green, and blue color filters 20R, 20G, and 20B, a transparent dielectric layer 25 that is disposed on the color filter layer 20, and a color separation element 30 that separates the incident light according to wavelengths and causes the separated light in different wavelength bands to travel along different paths. Structures and functions of the light-sensing layer 10, the color filter layer 20, and the isolation layer 21 may be the same as those described with reference to FIGS. 1A and 1B.

The color separation element 30 separates a color by varying a path along which the incident light travels according to wavelengths of the incident light by using diffraction and refraction characteristics of the incident light that vary according to the wavelengths. For example, various elements, such as a bar type element having a transparent symmetric or asymmetric structure, or a prism type element having an inclined surface, may be used as the color separation element 30, and the color separation element 30 may be variously designed according to a desired spectrum distribution of emitted light.

For example, as shown in FIG. 4, the color separation element 30 faces the green color filter 20G. In this case, the color separation element 30 causes, among incident light, light C2 in a green wavelength band to travel to the green color filter 20G that is below the color separation element 30, light C1 in a red wavelength band to travel to the red color filter 20R that is on the left, and light C3 in a blue wavelength band to travel to the blue color filter 20B that is on the right. Alternatively, the color separation element 30 may cause, among the incident light, the light C2 in the green wavelength band to travel to the green color filter 20G that is below the color separation element 30, and light C1+C3 obtained by combining the light C1 in the red wavelength band with the light C3 in the blue wavelength band to travel to the red and blue color filters 20R and 20B that are on the left and the right.

Because the intensity of light that transmits through the red, green, and blue color filters 20R, 20G, and 20B is increased due to the color separation element 30, light use efficiency of the image sensor 120 may be improved. Furthermore, because the color separation element 30, the isolation layer 21, and the red, green, and blue color filters 20R, 20G, and 20B having hemispherical lower portions are used together, light that is separated by the color separation element 30 may be more efficiently used. Light that is separated by the color separation element 30 and is incident on the red, green, and blue color filters 20R, 20G, and 20B may travel obliquely. The isolation layer 21 may totally reflect the light that travels obliquely in the red, green, and blue color filters 20R, 20G, and 20B, and the hemispherical lower portions of the red, green, and blue color filters 20R, 20G, and 20B may refract the light that travels obliquely, thereby preventing the light from being incident on the other adjacent ones of the red, green, and blue light-sensing cells 10R, 10G, and 10B. Accordingly, light use efficiency of the image sensor 120 may be improved, and color purity of the image sensor 120 may also be improved.

The color separation element 30 is fixedly buried in the transparent dielectric layer 25. To sufficiently diffract and refract incident light, the color separation element 30 may be formed of a material having a refractive index that is higher than a refractive index of an adjacent element. That is, a refractive index of the color separation element 30 may be higher than a refractive index of the transparent dielectric layer 25. For example, the transparent dielectric layer 25 may be formed of $SiO_2$ or siloxane-based spin-on glass (SOG), and the color separation element 30 may be formed of a material having a high refractive index such as $TiO_2$, $SiN_3$, ZnS, ZnSe, or $Si_3N_4$. A type and a material of the color separation element 30 may be variously selected according to desired color separation characteristics.

Figure 5A:
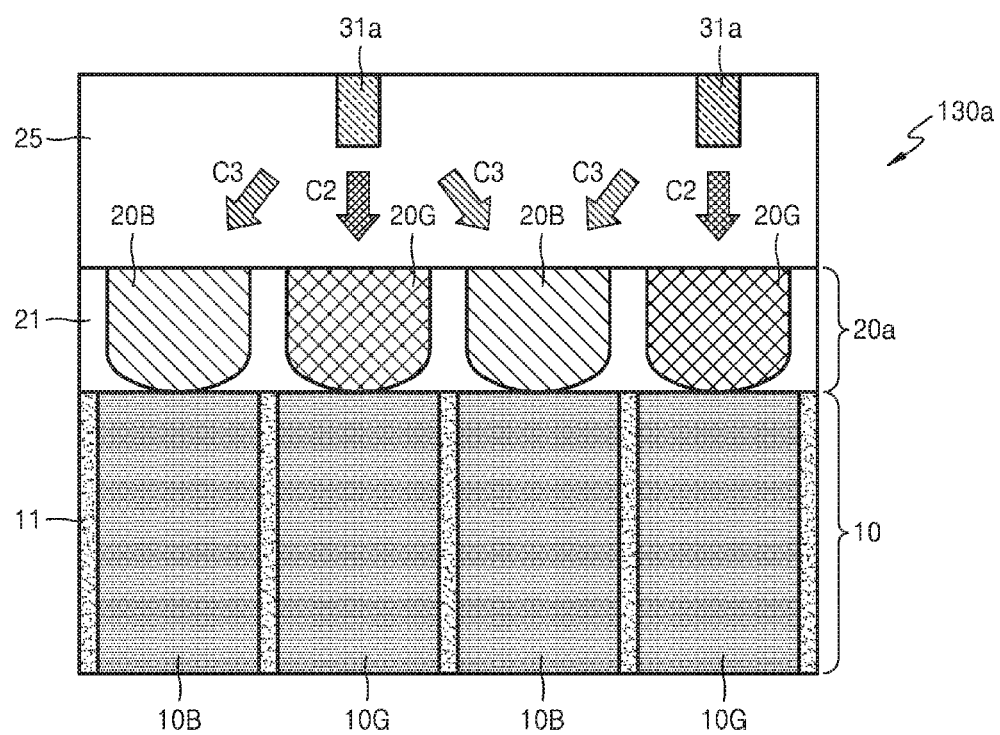
FIGS. 5A and 5B are cross-sectional views illustrating structures of a first pixel row and a second pixel row of an image sensor according to another exemplary embodiment.
Figure 5B:
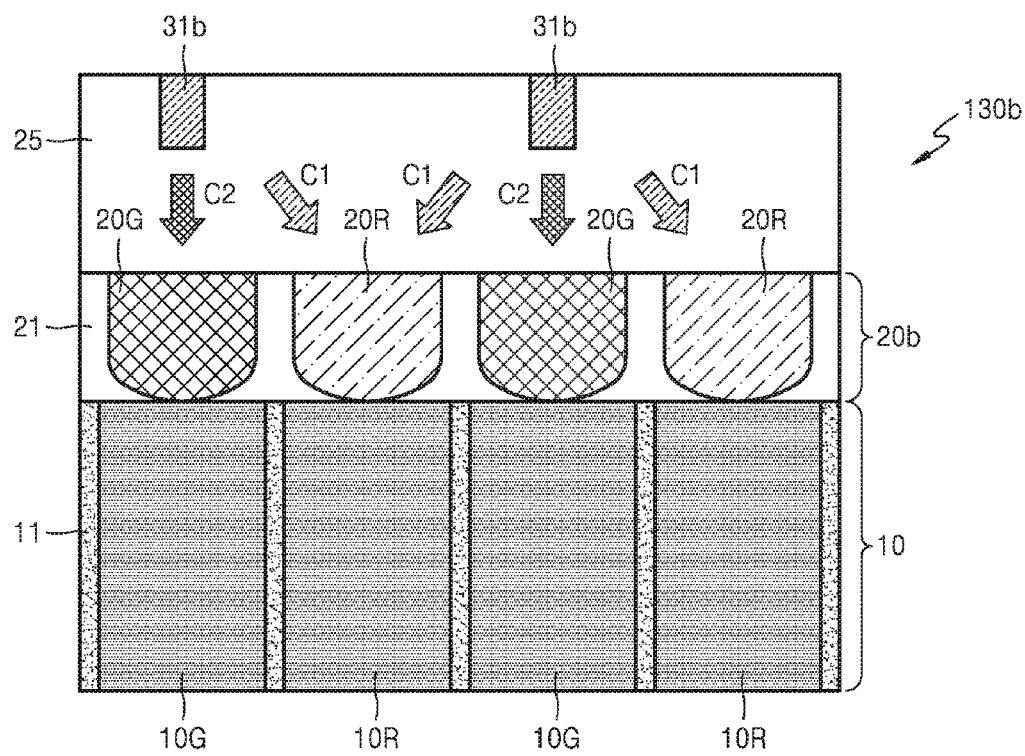

FIGS. 5A and 5B are cross-sectional views illustrating structures of a first pixel row 130a and a second pixel row 130b of an image sensor according to another exemplary embodiment. The first pixel row 130a of FIG. 5A includes the light-sensing layer 10, and the first color filter layer 20a including the plurality of blue color filters 20B and the plurality of green color filters 20G that are alternately arranged on the light-sensing layer 10. The first pixel row 103a further includes the isolation layer 21 that is disposed between the blue color filters 20B and the green color filters 20G, the transparent dielectric layer 25 that is disposed on the first color filter layer 20a, and a first color separation element 31a that separates incident light according to wavelengths and causes light in different wavelength bands to travel along different paths. Structures and functions of the light-sensing layer 10, the first color filter layer 20a, and the isolation layer 21 may be the same as those described with reference to FIG. 3A.

Also, the second pixel row 130b of FIG. 5B includes the light-sensing layer 10, and the second color filter layer 20b including the plurality of red color filters 20R and the plurality of green color filters 20G that are alternately arranged on the light-sensing layer 10. The second pixel row 130b further includes the isolation layer 21 that is disposed between the green color filters 20G and the red color filters 20R, the transparent dielectric layer 25 that is disposed on the second color filter layer 20b, and a second color separation element 31b that separates incident light according to wavelengths and causes light in different wavelength bands to travel along different paths. Structures and functions of the light-sensing layer 10, the second color filter layer 20b, and the isolation layer 21 may be the same as those described with reference to FIG. 3B.

As shown in FIGS. 5A and 5B, the first color separation element 31a and the second color separation element 31b are fixedly buried in the transparent dielectric layer 25. Also, the first color separation element 31a face each of the green color filters 20G of the first pixel row 130a, and the second color separation element 31b face each of the green color filters 20G of the second pixel row 130b.

In FIG. 5A, the first color separation element 31a causes, among the incident light, the light C2 in the green wavelength band to travel to the green color filter 20G that is below the first color separation element 31a, and the light C3 in the blue wavelength band to travel to the blue color filters 20B that are on the left and right. In this case, when light is the light C2 in the green wavelength band, it means that a ratio of the light C2 in the green wavelength band is high, and when light is the light C3 in the blue wavelength band, it means that a ratio of the light C3 in the blue wavelength band is high. Accordingly, the light C1 in the red wavelength band and the light C3 in the blue wavelength band may be included in the light C2 in the green wavelength band, and the light C1 in the red wavelength band and the light C2 in the green wavelength band may be included in the light C3 in the blue wavelength band.

In FIG. 5B, the second color separation element 31b causes, among the incident light, the light C2 in the green wavelength band to travel to the green color filter 20G that is below the second color separation element 31b, and the light C1 in the red wavelength band to travel to the red color filters 20R that are on the left and right. In this case, when light is the light C2 in the green wavelength band, it means that a ratio of the light C2 in the green wavelength band is high, and when light is the light C1 in the red wavelength band, it means that a ratio of the light C1 in the red wavelength band is high. Accordingly, the light C1 in the red wavelength band and the light C3 in the blue wavelength band may be included in the light C2 in the green wavelength band, and the light C2 in the green wavelength band the light C3 in the blue wavelength band may be included in the light C1 in the red wavelength band.

Alternatively, the first color separation element 31a and the second color separation element 31b may be configured to have the same function. In this case, each of the first and second color separation elements 31a and 31b may cause, among the incident light, the light C2 in the green wavelength band to travel to the green color filter 20G that is below each of the first and second color separation elements 31a and 31b, and the light C1+C3 obtained by combining the light C1 in the red wavelength band with the light C3 in the blue wavelength band to travel to the blue color filters 20B or the red color filters 20R that are on the left and right.

FIGS. 6A, 6B, 6C, and 6D are cross-sectional views illustrating a method of manufacturing the image sensor 100 of FIGS. 1A and 1B.

Figure 6A:
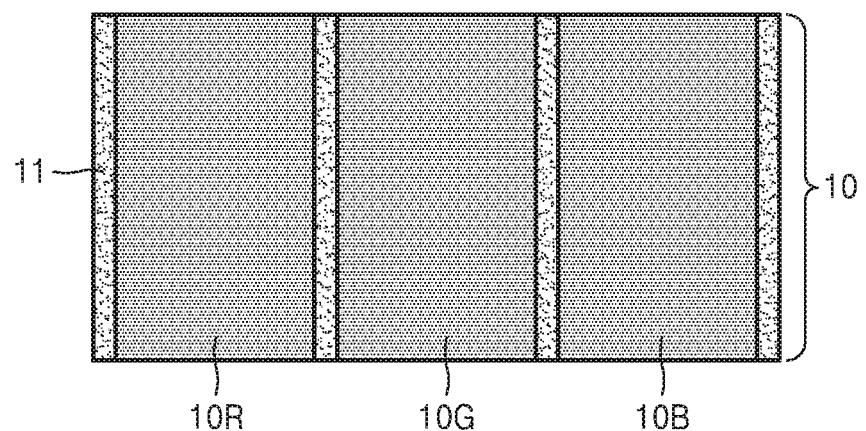
FIGS. 6A, 6B, 6C, and 6D are cross-sectional views illustrating a method of manufacturing the image sensor of FIGS. 1A and 1B.

First, referring to FIG. 6A, the light-sensing layer 10 that is divided into the plurality of light-sensing cells 10R, 10G, and 10B that independently detect incident light and generate an electrical signal based on the detected light, is prepared. The separation layer 11 is disposed between the red, green, and blue light-sensing cells 10R, 10G, and 10B. Also, the light-sensing layer 10 may include a CCD or a CMOS.

Figure 6B:
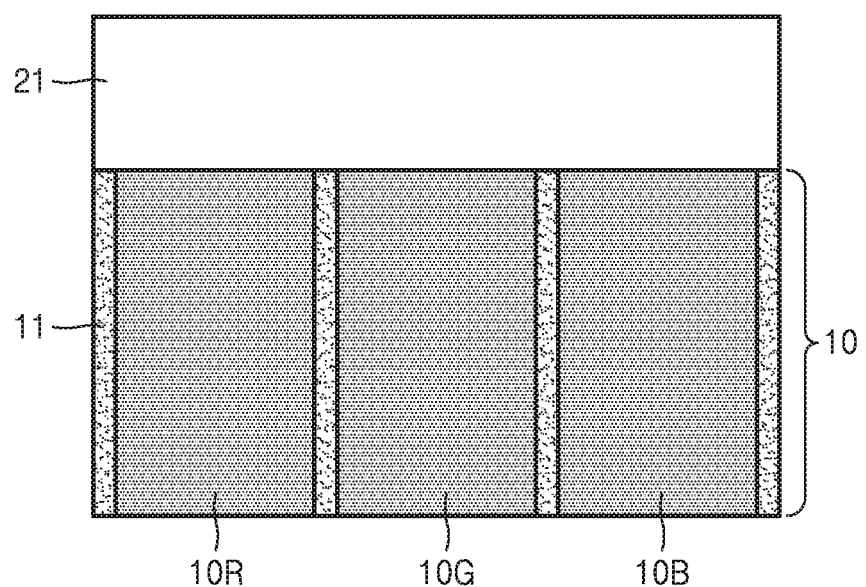

Next, referring to FIG. 6B, the isolation layer 21 is formed on the light-sensing layer 10. The isolation layer 21 may be formed of a material having a refractive index that is lower than refractive indices of the red, green, and blue color filters 20R, 20G, and 20B. For example, the isolation layer 21 may be formed of a material such as PMMA, CAB, $SiO_2$, or FSA. The isolation layer 21 may be formed of any material as long as a condition for a refractive index is satisfied, and may use a material that may be formed by using PVD or CVD.

Figure 6C:
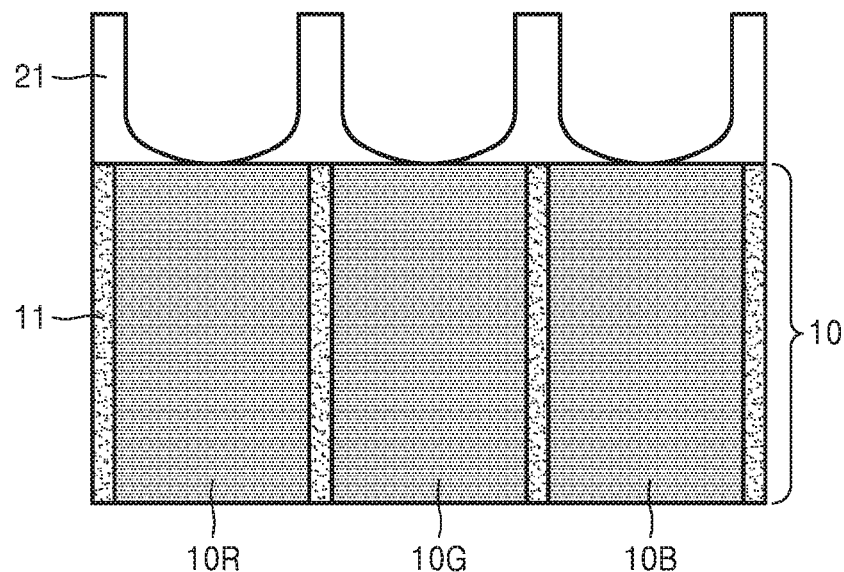

Next, referring to FIG. 6C, after the isolation layer 21 is formed, the isolation layer 21 is etched by using chemical mechanical polishing (CMP) or etching to form etched regions in which the red, green, and blue color filters 20R, 20G, and 20B are to be formed. Also, the etched regions are formed not to exceed or penetrate surfaces of the red, green, and blue light-sensing cells 10R, 10G, and 10B.

In detail, the isolation layer 21 is etched into a cylindrical shape in a first section. After the etching in the first section is completed, the isolation layer 21 is etched into a hemispherical shape in a second section. The isolation layer 21 does not have to have a hemispherical shape in the second section, and may be etched into a shape that is bulged downward in the second section.

Figure 6D:
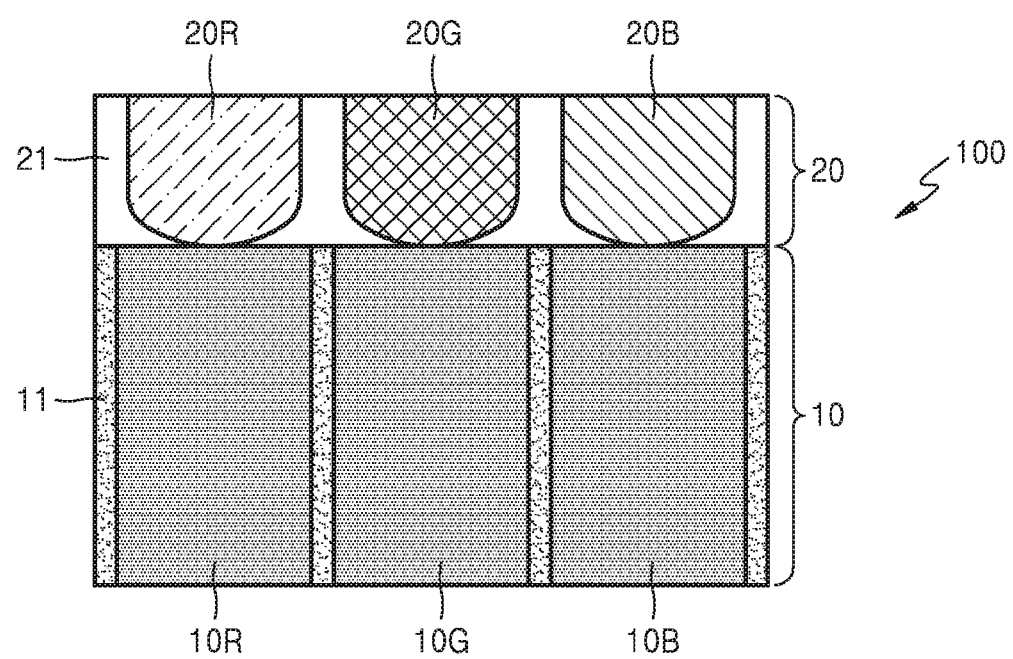

Next, referring to FIG. 6D, the red, green, and blue color filters 20R, 20G, and 20B are formed in the etched regions to form the color filter layer 20. The red, green, and blue color filters 20R, 20G, and 20B are formed to respectively correspond to the red, green, and blue light-sensing cells 10R, 10G, and 10B that are disposed under the color filter layer 20.

According to the exemplary embodiments, light that is obliquely incident on a color filter and escapes through a side surface of the color filter, may be totally reflected by an isolation layer that is disposed between color filters, and may return to the color filter. Also, light that is incident at an inclined angle on the color filter and escapes through the side surface of the color filter without being totally reflected by the isolation layer, may be refracted to the color filter due to a hemispherical lower portion of the color filter. Accordingly, light loss may be prevented, and light use efficiency may be improved. Also, because crosstalk that occurs when light that escapes through a side surface of a color filter is incident on a light-sensing element of an adjacent pixel may be prevented, an accurate color may be detected even at an edge portion of an image sensor.

The foregoing exemplary embodiments and advantages are merely examples and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An image sensor comprising:
   a light-sensing layer configured to detect incident light, and convert the incident light to an electrical signal;
   a color filter layer disposed on the light-sensing layer, the color filter layer comprising color filters, each of the color filters being configured to transmit, among the incident light, light in a wavelength band to the light-sensing layer; and
   an isolation layer disposed between the color filters, the isolation layer being configured to optically isolate the color filters from each other,
   wherein an upper portion of each of the color filters has a cylindrical shape, and a lower portion of each of the color filters has a hemispherical shape.

2. The image sensor of claim 1, wherein the isolation layer has a refractive index less than refractive indices of the color filters.

3. The image sensor of claim 1, wherein the light-sensing layer comprises:
   light-sensing cells; and
   a separation layer disposed between the light-sensing cells.

4. The image sensor of claim 1, wherein the color filters comprise:
   a first color filter configured to transmit, among the incident light, light in a first wavelength band through the first color filter to the light-sensing layer;
   a second color filter configured to transmit, among the incident light, light in a second wavelength band through the second color filter to the light-sensing layer; and
   a third color filter configured to transmit, among the incident light, light in a third wavelength band through the third color filter to the light-sensing layer.

5. The image sensor of claim 4, further comprising a color separation element disposed to face the first color filter.

6. The image sensor of claim 5, wherein the color separation element is configured to cause, among the incident light, the light in the first wavelength band to travel to the first color filter, the light in the second wavelength band to travel to the second color filter, and the light in the third wavelength band to travel to the third color filter.

7. The image sensor of claim 5, further comprising a transparent dielectric layer disposed on the color filter layer, wherein the color separation element is disposed in the transparent dielectric layer.

8. The image sensor of claim 5, wherein the color separation element is configured to cause, among the incident light, the light in the first wavelength band to travel to the first color filter, and light comprising the light in the second wavelength band and the light in the third wavelength band to travel to the second color filter and the third color filter.

9. The image sensor of claim 1, wherein the isolation layer comprises at least one selected from the group consisting of polymethylmetacrylate, silicon acrylate, cellulose acetate butyrate, silicon oxide, and fluoro-silicon acrylate.

10. The image sensor of claim 1, wherein the color filter layer comprises:
  a first pixel row comprising:
    a first portion of first color filters configured to transmit, among the incident light, light in a first wavelength band through the first color filters to the light-sensing layer; and
    second color filters configured to transmit, among the incident light, light in a second wavelength band through the second color filters to the light-sensing layer; and
  a second pixel row comprising:
    a second portion of the first color filters; and
    third color filters configured to transmit, among the incident light, light in a third wavelength band through the third color filters to the light-sensing layer.

* * * * *